(12) United States Patent
Koda et al.

(10) Patent No.: US 8,372,670 B2
(45) Date of Patent: Feb. 12, 2013

(54) LIGHT-EMITTING ELEMENT ASSEMBLY AND METHOD FOR MANUFACTURING THE SAME

(75) Inventors: Rintaro Koda, Tokyo (JP); Takahiro Arakida, Kanagawa (JP); Satoshi Taniguchi, Kanagawa (JP); Yuji Masui, Kanagawa (JP); Nobuhiro Suzuki, Kanagawa (JP); Tomoyuki Oki, Miyagi (JP); Chiyomi Uchiyama, Kanagawa (JP); Kayoko Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 349 days.

(21) Appl. No.: 12/841,812

(22) Filed: Jul. 22, 2010

(65) Prior Publication Data

US 2010/0285625 A1 Nov. 11, 2010

Related U.S. Application Data

(62) Division of application No. 12/333,972, filed on Dec. 12, 2008, now Pat. No. 7,787,512.

(30) Foreign Application Priority Data

Dec. 26, 2007 (JP) ................................. 2007-334254

(51) Int. Cl.
*G01R 31/26* (2006.01)
*H01L 21/66* (2006.01)

(52) U.S. Cl. .................................. 438/39; 257/E33.005

(58) Field of Classification Search ........................ None
See application file for complete search history.

(56) References Cited

U.S. PATENT DOCUMENTS

| 7,511,311 B2 * | 3/2009 | Kususe et al. ................. 257/95 |
| 2006/0249738 A1 | 11/2006 | Ortsiefer |
| 2010/0074290 A1 | 3/2010 | Kawaguchi et al. |

FOREIGN PATENT DOCUMENTS

| JP | HEI 54-014181 | | 2/1979 |
| JP | HEI 62-143486 | A | 6/1987 |
| JP | 03-190295 | | 8/1991 |
| JP | 03-263390 | | 11/1991 |
| JP | 2001-210908 | A | 8/2001 |
| JP | 2003-086895 | A | 3/2003 |
| JP | 2004-228282 | A | 8/2004 |
| JP | 2007-508702 | A | 4/2007 |

OTHER PUBLICATIONS

Japanese Office Action issued on Aug. 23, 2011 in connection with counterpart JP Application No. 2007-334254.
Japanese Patent Office, Office Action corresponding to Japanese Serial No. 2007-334254 dated Dec. 1, 2008.

* cited by examiner

*Primary Examiner* — Seahvosh Nikmanesh
(74) *Attorney, Agent, or Firm* — SNR Denton US LLP

(57) ABSTRACT

A method for making a light-emitting element assembly including a support substrate having a first surface, a second surface facing the first surface, a recessed portion, and a conductive material layer formed over the first surface and the inner surface of the recessed portion, and a light-emitting element. The light-emitting element has a laminated structure including a first compound semiconductor layer, a light-emitting portion, and a second compound semiconductor layer, at least the second compound semiconductor layer and the light-emitting portion constituting a mesa structure. The light-emitting element further includes an insulating layer formed, a second electrode, and a first electrode. The mesa structure is placed in the recessed portion so that the conductive material layer and the second electrode are in at least partial contact with each other, and light emitted from the light-emitting portion is emitted from the second surface side of the first compound semiconductor layer.

8 Claims, 13 Drawing Sheets

[STEP-100]

[STEP-110]

[STEP-110] (CONTINUED)

[STEP-120]

[STEP-120] (CONTINUED)

[STEP-130]

[STEP-130] (CONTINUED)

[STEP-300]

[STEP-320]

[STEP-330]

[STEP-340]

US 8,372,670 B2

LIGHT-EMITTING ELEMENT ASSEMBLY AND METHOD FOR MANUFACTURING THE SAME

CROSS REFERENCES TO RELATED APPLICATIONS

This application is a division of U.S. patent application Ser. No. 12/333,972, filed Dec. 12, 2008, the entirety of which is incorporated herein by reference to the extent permitted by law. The present invention claims priority to and contains subject matter related to Japanese Patent Application JP 2007-334254 filed in the Japanese Patent Office on Dec. 26, 2007, which is incorporated herein by reference in its entirety to the extent permitted by law.

BACKGROUND OF THE INVENTION

The present invention relates to a light-emitting element assembly and a method for manufacturing the same.

In a surface emitting laser element, for example, an active layer having a multiquantum well structure is provided in a cavity held between two mirror layers (Distributed Bragg Reflector layers, DBR layers) which are provided on a substrate in the thickness direction thereof, and light emitted from the active layer (light-emitting portion) due to current injection is enclosed to cause laser oscillation. Such a surface emitting laser element uses a cylindrical mesa structure as disclosed in, for example, Japanese Unexamined Patent Application Publication No. 2001-210908. Specifically, a cylindrical mesa structure with a diameter of about 30 μm may be formed, for example, on the basis of a dry etching process or the like. The mesa structure has a laminated structure including, for example, an n-type compound semiconductor layer, an active layer (light-emitting portion), and a p-type compound semiconductor layer. Then, the p-type compound semiconductor layer is partially oxidized from the side of the mesa structure to provide a current-narrowing region in a central portion of the p-type compound semiconductor layer. Then, the mesa structure is coated with an insulating layer, the top of the p-type compound semiconductor layer is partially removed, and a p-side ring electrode is formed in the periphery of the top of the p-type compound semiconductor layer. In addition, an n-side electrode is formed on the back surface of the substrate. By providing such a current-narrowing region, high-efficiency current injection into the active layer may be achieved. A surface-emitting laser element having such a structure permits high-efficiency current injection into the active layer and light-efficiency laser oscillation.

Further, a current is injected into the active layer through the two mirror layers provided above and below the active layer and composed of compound semiconductor layers. However, such mirror layers have low thermal conductivity and thus do not effectively radiate heat generated in the active layer. As a result, there occurs the problem of decreasing the emission efficiency of the surface emitting laser element. Therefore, a surface emitting laser element of related art has a structure in which it is mounted on a sub-mount serving as a heat sink with a solder so that a p-side electrode faces downward, as disclosed in FIG. 4 and paragraph [0048] of Japanese Unexamined Patent Application Publication No. 2003-086895.

SUMMARY OF THE INVENTION

In the technique disclosed in Japanese Unexamined Patent Application Publication No. 2003-086895, a wafer on which light-emitting elements have been formed is divided into individual chips, and each of the chips is mounted on the sub-mount so that an etched groove is completely filled with the solder, forming a vertical oscillator-type light-emitting element shown in FIG. 4 of Japanese Unexamined Patent Application Publication No. 2003-086895 (refer to paragraph [0058] of Japanese Unexamined Patent Application Publication No. 2003-086895).

However, an assembling work of dividing a wafer into chips and then mounting each chip on a sub-mount is a very complicated and costly work. In addition, the active layer and the solder layer are spaced from each other, and thus heat radiation of the active layer may be insufficient. Further, light emitted from the active layer is emitted through a n-type GaP substrate, not directly emitted through a DBR mirror. Therefore, a substrate transparent to the emission wavelength is used, thereby causing the problem of decreasing the degree of design freedom.

Therefore, it is desirable to provide a light-emitting element assembly having a configuration and structure capable of effectively radiating heat generated in a light-emitting portion and of being assembled by a simple work, and a method for manufacturing the assembly. Also, it is desirable to provide a light-emitting element assembly having a configuration and structure with a high degree of design freedom without using a substrate transparent to an emission wavelength, and a method for manufacturing the assembly.

A light-emitting element assembly according to an embodiment of the present invention includes (A) a support substrate having a first surface, a second surface facing the first surface, a recessed portion formed in the first surface, and a conductive material layer formed over the first surface and the inner surface of the recessed portion; and (B) a light-emitting element. The light-emitting element has a laminated structure including (B-1) a first compound semiconductor layer of a first conductivity type which has a first surface and a second surface facing the first surface, (B-2) a light-emitting portion laminated on the first surface of the first compound semiconductor layer, and (B-3) a second compound semiconductor layer of a second conductivity type which is laminated on the light-emitting portion, at least the second compound semiconductor layer and the light-emitting portion constituting a mesa structure. The light-emitting element further includes (B-4) an insulating layer formed over at least the side surface of the mesa structure and the first surface of the first compound semiconductor layer, (B-5) a second electrode formed over the top of the second compound semiconductor layer and the insulating layer, and (B-6) a first electrode formed on the second surface of the first compound semiconductor layer. The mesa structure of the light-emitting element is placed in the recessed portion so that the conductive material layer and the second electrode are in at least partial contact with each other, and light emitted from the light-emitting portion is emitted from the second surface side of the first compound semiconductor layer.

In the light-emitting element assembly according to the embodiment of the invention, the first compound semiconductor layer includes a first portion extending so as to face the first surface of the support substrate through the insulating layer and a second portion projecting from the first portion. The first electrode is formed on the first portion of the first compound semiconductor layer, and the second portion of the first compound semiconductor layer is included in a projective image of the mesa structure along the axial direction of the recessed portion. The light emitted from the light-emitting portion may be emitted from the second portion of the first compound semiconductor layer. This configuration is referred to as a "first configuration" for the sake of convenience. The axial line of the recessed portion represents a straight line passing through the center of the bottom of the recessed portion and being parallel to the thickness direction of the support substrate or a normal line passing through the bottom of the recessed portion. This applies to the description below. Although the second portion of the first compound semiconductor layer is included in a projective image of the mesa structure along the axial direction of the recessed portion (hereinafter, may be simply referred to as a "projective image of the mesa structure"), the planar shape of the second portion of the first compound semiconductor layer is preferably the same as the shape of the projective image of the mesa structure. The planar shape of the second portion of the first compound semiconductor layer may be larger than that of the projective image of the mesa structure due to variations in manufacturing. In this case, however, the second portion of the first compound semiconductor layer is considered to be included in the projective image of the mesa structure. This applies to the description below.

In the light-emitting element assembly according to the embodiment of the invention, the first electrode may not be formed within the projective image of the mesa structure along the axial direction of the recessed portion. This configuration is referred to as a "second configuration" for the sake of convenience. In this case, unlike in the first configuration, the first compound semiconductor layer may not be divided into the first portion and the second portion. Although the first electrode is not formed within the projective image of the mesa structure, the planar shape of the edge of the first electrode is preferably the same as the shape of the projective image of the mesa structure. The first electrode may be formed within the projective image of the mesa structure due to variations in manufacturing. In this case, however, the first electrode is considered to be not formed within the projective image of the mesa structure. This applies to the description below.

In the light-emitting element assembly having each of the above-described preferred configurations, a third electrode is formed on the second surface of the support substrate, and the support substrate has electric conductivity so that a current is passed between the third electrode and the first electrode to emit light from the light-emitting portion.

In the light-emitting element assembly having each of the above-described preferred configurations, the conductive material layer is preferably bonded to the second electrode. Further, the light-emitting element may be a surface emitting laser element (vertical cavity surface emitting laser, VCSEL) or a light-emitting diode (LED).

A method for manufacturing a light-emitting element assembly according to a first embodiment of the present invention includes the steps of (a) preparing a support substrate having a first surface, a second surface facing the first surface, a recessed portion formed in the first surface, and a conductive material layer formed over the first surface and the inner surface of the recessed portion, (b) successively forming a first compound semiconductor layer of a first conductivity type, a light-emitting portion, and a second compound semiconductor layer of a second conductivity type on a substrate for manufacturing a light-emitting element, (c) selectively removing at least the second compound semiconductor layer and the light-emitting portion to form a mesa structure including at least the second compound semiconductor layer and the light-emitting portion, (d) forming an insulating layer over the top and the side surface of the mesa structure and an exposed portion of a first surface of the first compound semiconductor layer, partially removing the insulating layer from the top of the mesa structure to expose the top of the second compound semiconductor layer, and then forming a second electrode over the exposed portion of the top of the second compound semiconductor layer, a portion of the insulating layer which is disposed on the side surface of the mesa structure, and a portion the insulating layer which is disposed on the first surface of the first compound semiconductor layer, (e) placing the mesa structure of the light-emitting element in the recessed portion so that the conductive material layer and the second electrode are in at least partial contact with each other, (f) removing the substrate for manufacturing a light-emitting element, and then (g) forming a first electrode on an exposed second surface of the first compound semiconductor layer which faces the first surface thereof.

The method for manufacturing a light-emitting element assembly according to the first embodiment of the invention further includes a step of partially removing the first compound semiconductor layer in the thickness direction thereof in succession to the step (f). The first compound semiconductor layer is partially removed in the thickness direction to form a first portion extending so as to face the first surface of the support substrate through the insulating layer and a second portion projecting from the first portion. The first electrode is formed on the first portion of the first compound semiconductor layer, and the second portion of the first compound semiconductor layer is included in a projective image of the mesa structure along the axial direction of the recessed portion. The light emitted from the light-emitting portion may be emitted from the second portion of the first compound semiconductor layer. Consequently, a light-emitting element assembly having the first configuration may be obtained.

In the method for manufacturing a light-emitting element assembly according to the first embodiment of the invention, the first electrode may not be formed within the projective image of the mesa structure along the axial direction of the recessed portion. Consequently, a light-emitting element assembly with the second configuration may be obtained.

A method for manufacturing a light-emitting element assembly according to a second embodiment of the present invention includes the steps of (a) preparing a support substrate having a first surface, a second surface facing the first surface, and a conductive material layer formed on the first surface, (b) successively forming a first compound semiconductor layer of a first conductivity type, a light-emitting portion, and a second compound semiconductor layer of a second conductivity type on a substrate for manufacturing a light-emitting element, (c) forming a second electrode on the second compound semiconductor layer, (d) bonding together the second electrode and the conductive material layer formed on the first surface of the support substrate, (e) removing the substrate for manufacturing a light-emitting element, (f) forming a mesa structure including at least the first compound semiconductor layer and the light-emitting portion, and then (g) forming a first electrode on the top of the first compound semiconductor layer.

The method for manufacturing a light-emitting element assembly according to the second embodiment of the invention may further include, after the step (f), a step of forming an insulating layer over the top and the side surface of the mesa structure and the exposed second compound semiconductor layer and partially removing the insulating layer from the top of the mesa structure to expose the top of the first compound semiconductor layer.

In the method for manufacturing a light-emitting element assembly having each of the above-described preferred configurations according to the first or second embodiment of the invention, a third electrode may be formed on the second surface of the support substrate, and the support substrate may have electric conductivity. Further, the light-emitting element may be a surface emitting laser element. In the method for manufacturing a light-emitting element assembly having each of the above-described preferred configurations according to the second embodiment of the invention, the light-emitting element may be a surface emitting laser element in which light is emitted from the exposed top of the first compound semiconductor layer. In addition, the light-emitting element may be a light-emitting diode (LED).

In the light-emitting element assembly having each of the preferred configurations according to an embodiment of the invention or the method for manufacturing a light-emitting element assembly having each of the preferred configurations according to the first or second embodiment of the invention (these may be generally simply named "the present invention" hereinafter), a current is injected into the light-emitting portion to emit light therefrom. However, it is preferred to form a region (current-narrowing region) which narrows a current in a portion of the compound semiconductor layer disposed upstream of the light-emitting portion in the flow direction of the current. The current-narrowing region may be configured to be surrounded by an insulating region which is formed by insulating a portion of the compound semiconductor layer.

An insulating treatment may be performed by inward oxidation of the compound semiconductor layer from the exposed portion of the compound semiconductor layer in the side surface of the mesa structure. However, the insulating treatment is not limited to this and may be performed by nitriding, disordering a portion of the compound semiconductor layer, or diffusing impurities in a portion of the compound semiconductor layer by ion implantation in a portion of the compound semiconductor layer and then heat treatment. When the insulating treatment is performed by oxidation, the oxidation may be performed using high-temperature water vapor (for example, air atmosphere containing 1% by volume to 50% by volume of water vapor of 50° C. to 100° C.). In this case, the compound semiconductor layer has a three-layer structure including a lower layer, an intermediate layer (current-narrowing region), and an upper layer provided in that order from the light-emitting portion side, and at least the intermediate layer is composed of a group III-V compound semiconductor including aluminum (Al) as a group III atom. The insulating region and the current-narrowing region are formed in the intermediate layer. The atomic percentage of aluminum (Al) in the compound semiconductor composition of the intermediate layer may be higher than that in the compound semiconductor composition of the lower and upper layers. The group III atoms include gallium (Ga) and indium (In), the group V atoms include arsenic (As), phosphorus (P), and antimony (Sb). More specifically, examples of a combination of compound semiconductor compositions of (intermediate layer/lower and upper layers) include (AlAs/GaAs), (AlAs/InAs), (AlAs/AlGaAs), (AlAs/AlInAs), (AlAs/AlAsP), (AlAs/GaInAs), (AlAs/AlGaInAs), (AlAs/GaInAsP), (AlP/GaP), (AlP/InP), (AlP/AlGaP), (AlP/AlInP), (AlP/AlAsP), (AlP/AlGaInP), (AlSb/AlInSb), (AlGaAs/AlGaAs), (AlInAs/AlInGaAs), (AlInAs/AlGaAs), (AlGaAs/AlGaAsP), (AlInAsP/AlGaAsP), and (AlN/AlGaN).

Examples of a compound semiconductor constituting the compound semiconductor layer not subjected to the insulating treatment (the first compound semiconductor layer when the second compound semiconductor layer is subjected the insulating treatment or the second compound semiconductor layer when the first compound semiconductor layer is subjected the insulating treatment) include AlAs, GaAs, AlGaAs, AlP, GaP, GaInP, AlInP, AlGaInP, AlAsP, GaAsP, AlGaAsP, AlInAsP, GaInAsP, AlInAs, GaInAs, AlGaInAs, AlAsSb, GaAsSb, AlGaAsSb, AN, GaN, InN, and AlGaN. Examples of a compound semiconductor constituting the light-emitting portion include GaAs, AlGaAs, GaInAs, GaInAsP, GaInP, GaSb, GaAsSb, GaN, InN, and GaInN.

Examples of a method for forming (depositing) these layers include a metal organic chemical vapor phase deposition method (MOCVD method), a molecular beam epitaxial method (MBE method), and a hydride vapor phase deposition method in which halogen contributes to transport or reaction.

In the light-emitting element assembly according to an embodiment of the invention or the method for manufacturing a light-emitting element assembly according to the first embodiment of the invention, at least portions of the second compound semiconductor layer and the light-emitting portion are selectively removed to expose a portion of the first compound semiconductor layer (the exposed portion is the first surface of the first compound semiconductor layer), and to form the columnar (for example, cylindrical) mesa structure including at least the remaining second compound semiconductor layer and light-emitting portion. However, not only the second compound semiconductor layer and the light-emitting portion are selectively removed but also a portion of the first compound semiconductor layer may be selectively removed in the thickness direction. In this case, the exposed portion is the first surface of the first compound semiconductor layer. In other words, the mesa structure is a structure in which at least the second compound semiconductor layer and the light-emitting portion are left, for example, in an island form, but the second compound semiconductor layer, the light-emitting portion, and a portion of the first compound semiconductor layer may be left, for example, in an island form. The insulating region and the current-narrowing region may be formed in either the second compound semiconductor layer or the first compound semiconductor layer.

In the method for manufacturing a light-emitting element assembly according to the second embodiment of the invention, at least portions of the first compound semiconductor layer and the light-emitting portion are selectively removed to expose a portion of the second compound semiconductor layer and to form the columnar (for example, cylindrical) mesa structure including at least the remaining first compound semiconductor layer and light-emitting portion. However, not only the first compound semiconductor layer and the light-emitting portion are selectively removed but also a portion of the second compound semiconductor layer may be selectively removed in the thickness direction. In other words, the mesa structure is a structure in which at least the first compound semiconductor layer and the light-emitting portion are left, for example, in an island form, but the first compound semiconductor layer, the light-emitting portion, and a portion of the second compound semiconductor layer may be left, for example, in an island form. The insulating region and the current-narrowing region may be formed in either the first compound semiconductor layer or the second compound semiconductor layer.

In the method for manufacturing a light-emitting element assembly according to the first or second embodiment of the invention (hereinafter may be generally simply named the "method for manufacturing a light-emitting element assembly of the invention"), the mesa structure may be formed, for example, on the basis of combination of a lithographic technique and a dry etching or wet etching technique.

In the light-emitting element assembly according to an embodiment of the invention or the method for manufacturing a light-emitting element assembly according to the first embodiment of the invention, the mesa structure of the light-emitting element is placed in the recessed portion so that the conductive material layer and the second electrode are in at least partial contact with each other. Examples of a contact state between the conductive material layer and the second electrode include the following:

(1) a portion of the conductive material layer which is formed on the first surface of the support substrate and a portion of the second electrode which is formed on a portion of the insulating layer disposed to face the first surface of the support substrate;

(2) a portion of the conductive material layer which is formed on the side surface of the recessed portion formed in the support substrate and a portion of the second electrode which is formed on a portion of the insulating layer disposed on the side surface of the mesa structure; and (3) a portion of the conductive material layer which is formed at the bottom of the recessed portion formed in the support substrate and a portion of the second electrode which is formed on the top (second compound semiconductor layer) of the mesa structure.

The contact state may be the form (1), the form (2), the form (3), or combination of the forms (1) and (2), the forms (2) and (3), the forms (1) and (3), or the forms (1), (2), and (3).

In the method for manufacturing a light-emitting element assembly according to the first or second embodiment of the invention, examples of the substrate for manufacturing a light-emitting element include a sapphire substrate, a GaAs substrate, a GaN substrate, a SiC substrate, an alumina substrate, a ZnS substrate, a ZnO substrate, an AN substrate, a LiMgO substrate, a LiGaO$_2$ substrate, a MgAl$_2$O$_4$ substrate, an InP substrate, a Si substrate, and these substrates each having an underlying layer and a buffer layer formed on a surface (main surface). As the support substrate in the present invention, any one of the substrates given as the substrate for manufacturing a light-emitting element may be used. The recessed portion may be formed in the support substrate on the basis of combination of a lithographic technique and a proper etching technique depending on the material constituting the support substrate. The recessed portion may have a shape complementary to the shape of the mesa structure. That is, when the mesa structure has a columnar shape (for example, cylindrical shape), the recessed portion may have a columnar shape (for example, cylindrical shape).

When the support substrate has electric conductivity, a current may be passed between the third electrode and the first electrode. The support substrate preferably has electric conductivity, but the support substrate is not limited to this and may have insulation. In this case, a current may be passed between the second electrode or the conductive material layer and the first electrode, or a through hole may be provided between the third electrode and the conductive material layer so that a current is passed between the third electrode and the first electrode.

In the present invention, the first and second conductivity types may be n type and p type, or vice versa, respectively. Examples of n-type impurities added to the compound semiconductor layer include silicon (Si) and selenium (Se), and examples of p-type impurities added to the compound semiconductor layer include zinc (Zn), magnesium (Mg), and beryllium (Be).

In the present invention, for example, the lower layer (near the light-emitting portion) of the second compound semiconductor layer may be formed as a second cladding layer, and the upper layer (away from the light-emitting portion) of the second compound semiconductor layer may be formed as a second DBR layer. In addition, for example, the first compound semiconductor layer may have a laminated structure including a first DBR layer away from the light-emitting portion and a first cladding layer near the light-emitting portion. In this case, the light-emitting layer is composed of the active layer. Alternatively, a second DBR layer and a first DBR layer may be formed as the second compound semiconductor layer and the first compound semiconductor layer, respectively. In this case, the light-emitting layer has a laminated structure including a second cladding layer, an active layer, and a first cladding layer which are provided in that order from the second compound semiconductor layer side. The optical thickness of a layer constituting a DBR layer is generally $\lambda/4$ ($\lambda$: oscillation wavelength). The active layer has, for example, a single quantum well structure (SQW) or a multiquantum well structure (MQW).

A material which constitutes the first electrode may be determined by the conductivity type of the first compound semiconductor layer serving as an underlying layer for the first electrode. For example, when the conductivity type of the first compound semiconductor layer is p-type, the first electrode may be composed of silver (including a silver alloy containing In, Cu, Pd, Ni, Co, Rh, or Pt), Ti/Au, Cr/Au, or the like. When the conductivity type of the first compound semiconductor layer is n-type, the first electrode may be composed of titanium (Ti), a titanium alloy such as TiW or TiMo (e.g., a TiW layer, Ti/Ni/Au layers, or the like), aluminum (Al), an aluminum alloy, AuGe, AuGe/Ni/Au, or the like. When the first electrode is transparent, the electrode may be composed of a transparent electrode material such as ITO or the like. When the first electrode has a laminated structure, "/" indicates the deposition sequence from the side away from the light-emitting portion. In addition, for example, a contact portion (pad portion) composed of a multilayer metal layer with a laminated structure, such as [adhesive layer (Ti layer or Cr layer)]/[barrier metal layer (Pt layer, Ni layer, TiW layer, or Mo layer)]/[metal layer (e.g., an Au layer) having high compatibility with mounting], e.g., Ti layer/Pt layer/Au layer or the like, may be provided on the first electrode.

As a material which constitutes the second electrode, the same material as that constituting the first electrode may be used. As a material which constitutes the conductive material layer (functioning as a radiating layer), Au, Ag, Ti, W, Cr, In, Al, B, Ga, Zn, Sn, or Mg may be used. As a method for bonding together the second electrode and the conductive material layer, for example, a metal-metal bonding method of heating under a pressure or about 1 atm to 10 atm may be used. Further, the second electrode and the conductive material layer may be bonded together with a bonding member provided therebetween, the bonding member containing B, Al, Ga, In, Sn, Ag, or the like. A circuit may be formed in the conductive material layer. Further, as a material which constitutes the third electrode, the same material as that constituting the first electrode may be used.

The electrodes, the conductive material layer, and the contact portion (pad portion) may be formed by any one of various PVD methods such as a vacuum deposition method and a sputtering method, or a plating method.

Examples of a material constituting the insulating layer include SiO$_X$ materials including SiO$_2$, SiN$_X$ materials, SiO$_X$N$_Y$ materials, Ta$_2$O$_5$, ZrO$_2$, AN, Al$_2$O$_3$, and organic materials such as polyimide resins. The insulating layer may be formed by any one of various PVD methods such as a vacuum deposition method and a sputtering method, or a CVD method or formed on the basis of a coating method. When the insulating layer is removed from the top surface of the mesa structure, the insulting layer may be completely removed from the top of the mesa structure or partially removed from the central portion of the top of the mesa structure leaving the insulating layer at the edge of the top of the mesa structure. The insulating layer may be selectively removed, for example, on the basis of a lithographic technique and an etching technique. When the insulating material is composed of a photosensitive material (for example, when the insulating layer is composed of a photosensitive polyimide resin), the insulating layer may be selectively removed by exposure and development. That is, the step of forming the insulating layer over the top and the side surface of the mesa structure and the exposed portion of the first surface of the first compound semiconductor layer and partially removing the insulating layer from the top of the mesa structure may be a step of forming the insulating layer on the exposed portion of the first surface of the first compound semiconductor layer and then partially removing the insulating layer from the top of the mesa structure or a step of forming the insulating layer on the exposed portion of the first surface of the first compound semiconductor layer and, at the same time, partially removing the insulating layer from the top of the mesa structure. Alternatively, the step of forming the insulating layer over the top and the side surface of the mesa structure and the exposed surface of the second compound semiconductor layer and partially removing the insulating layer from the top of the mesa structure may be a step of forming the insulating layer over the top and the side surface of the mesa structure and the exposed surface of the second compound semiconductor layer and then partially removing the insulating layer from the top of the mesa structure or a step of forming the insulating layer over the top and the side surface of the mesa structure and the exposed surface of the second compound semiconductor layer and, at the same time, partially removing the insulating layer from the top of the mesa structure.

As a method for removing the substrate for manufacturing a light-emitting element, a wet etching method using ammonia solution and hydrogen peroxide solution, sulfuric acid solution and hydrogen peroxide solution, hydrochloric acid solution and hydrogen peroxide solution, or phosphoric acid solution and hydrogen peroxide solution, or a liftoff method using a laser may be used.

The method for manufacturing a light-emitting element assembly according each of the embodiments of the present invention is capable of manufacturing a plurality of light-emitting element assemblies on the support substrate through the step (g), and thus the light-emitting element assemblies may be separated into individual assemblies or a predetermined number of assemblies.

In a light-emitting element assembly according to an embodiment of the invention or a light-emitting element assembly manufactured by a method for manufacturing a light-emitting element assembly according to a first embodiment of the invention, a mesa structure of a light-emitting element is placed in a recessed portion so that a conductive material layer and a second electrode are in at least partial contact with each other. Therefore, the conductive material layer is present near the light-emitting portion, and thus heat generated in the light-emitting portion may be efficiently radiated. As a result, it may be possible to effectively prevent the occurrence of the problem of decreasing the emission efficiency of the light-emitting element and to extend the operating temperature range. In addition, since the substrate for manufacturing a light-emitting element is bonded to the support substrate, an assembling work of dividing a wafer into chips and then mounting each chip on a sub-mount is not used, thereby simplifying the assembling work.

Further, in the present invention, light generated in the light-emitting portion is emitted from the second surface side of the first compound semiconductor layer. However, since the substrate for manufacturing a light-emitting element is removed, emitted light is not absorbed by the substrate, thereby increasing the degree of freedom of material selection for the substrate for manufacturing a light-emitting element.

DETAILED DESCRIPTION OF THE PRESENTLY PREFERRED EMBODIMENTS

The present invention is described below on the basis of examples with reference to the drawings.

EXAMPLE 1

Example 1 relates to a light-emitting element assembly according to an embodiment of the present invention, and specifically to a light-emitting element assembly with a first configuration, and further relates to a method for manufacturing a light-emitting element assembly according to a first embodiment of the present invention. In Example 1 and Examples 2 and 3 described below, a first conductivity type is n-type, and a second conductivity type is p-type. In Example 1 and Examples 2 and 3 described below, a light-emitting element is a surface emitting laser element (vertical cavity surface emitting laser element, VCSEL) in which light is emitted through a first compound semiconductor layer.

Figure 1A:
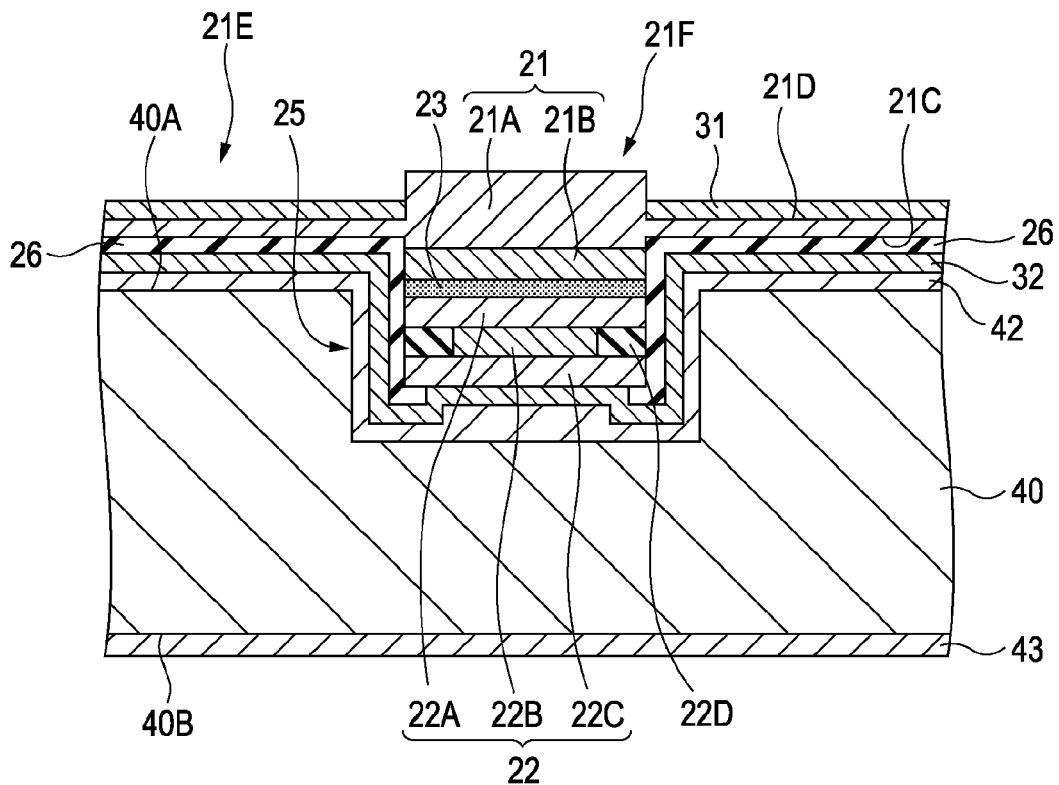
FIGS. 1A and 1B are a schematic partial sectional view of a light-emitting assembly of Example 1 and a schematic partial plan view of a support substrate, respectively.
Figure 1B:
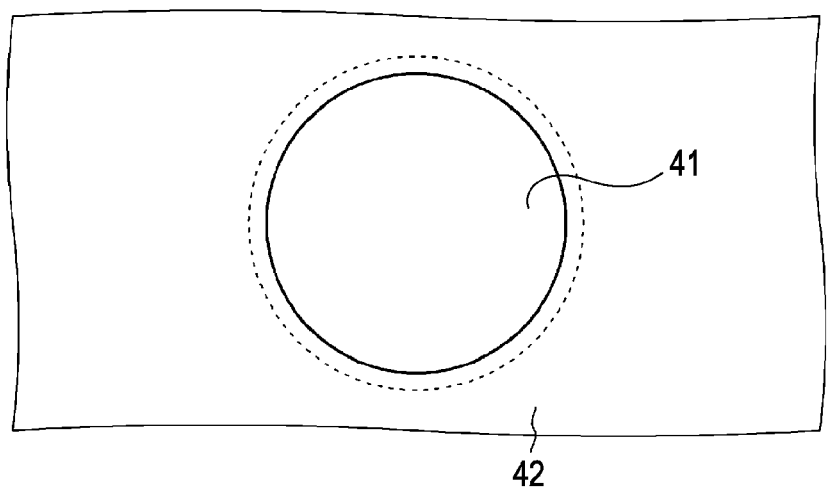

FIGS. 1A and 1B are a schematic partial sectional view of a light-emitting element assembly of Example 1 and a schematic partial plan view of a support substrate, respectively. The light-emitting element assembly of Example 1 is provided with a support substrate 40 and a light-emitting element. The support substrate 40 has a first surface 40A, a second surface 40B facing the first surface 40A, a recessed portion 41 formed in the first surface 40A, and a conductive material layer 42 (functioning as a heat radiating layer) formed over the first surface 40A and the inner surface of the recessed portion 40B. Specifically, the support substrate 40 is composed of GaAs, and the conductive material layer 42 has a laminated structure of AuGe/Ni/Au layers and Ni/Pt/Au layers which are deposited in order by a vacuum deposition method. Here, "/" indicates the deposition sequence from the side nearer to the support substrate 40. Further, a third electrode 43 composed of AuGe/Ni/Au layers is formed on the second surface 40B of the support substrate 40 by a vacuum deposition method.

On the other hand, the light-emitting element has a laminated structure including a first compound semiconductor layer 21, a light-emitting portion 23, and a second compound semiconductor layer 22. The first compound semiconductor layer 21 is of a first conductivity type (specifically, n-type) and is provided with a first surface 21C and a second surface 21D facing the first surface 21C. The light-emitting portion 23 is laminated on the first surface side of the first compound semiconductor layer 21. Further, the second compound semiconductor layer 22 is laminated on the light-emitting portion 23 and is of a second conductivity type (specifically, p-type). In addition, the light-emitting element is provided with a mesa structure 25 including at least the second compound semiconductor layer 22 and the light-emitting portion 23 (more specifically, the second compound semiconductor layer 22, the light-emitting portion 23, and a portion of the first compound semiconductor layer 21). With respect to a vertical relation between the compound semiconductor layers, the first compound semiconductor layer side and the second compound semiconductor layer side are expressed as a lower layer and an upper layer, respectively, for the sake of convenience. Therefore, in the expression "a B layer is formed on an A layer", the vertical relation between the A and B layers may be determined according to the above-described relation. In the drawings, the B layer may be present below the A layer.

The first compound semiconductor layer 21 has a laminated structure including a first DBR layer 21A and a first cladding layer 21B having the compositions described below, the first DBR layer 21A and the first cladding layer 21B being formed in that order from the side away from the light-emitting portion 23. The light-emitting portion 23 is composed of an active layer having a multiquantum well structure and the composition described below. The second compound semiconductor layer 22 has a laminated structure including a lower layer (second cladding layer) 22A, an intermediate layer (current-narrowing region) 22B, and an upper layer (second DBR layer) 22C having the compositions described below, the lower layer 22A, the intermediate layer 22B, and the upper layer 22C being formed in that order from the side near the light-emitting portion 23. The intermediate layer (current-narrowing region) 22B is surrounded by an insulating region 22D formed to extend from the side surface of the mesa structure 25 to the central portion thereof. The current-narrowing region 22B has a substantially circular planar shape having a diameter of about 10 µm. The mesa structure 25 has a columnar shape having a diameter of 30 µm and a height of about 3 µm to 5 µm. The planar shape of the current-narrowing region 22B influences, for example, FFP (Far Field Pattern), a transverse mode, and a longitudinal mode.

| Second compound semiconductor layer 22 | |
|---|---|
| Upper layer (second DBR layer) 22C | DBR layer formed by alternately laminating p-$Al_{0.9}Ga_{0.1}As$ layers and p-$Al_{0.1}Ga_{0.9}As$ layers |
| Intermediate layer (current-narrowing layer) 22B | p-AlAs |
| Lower layer (second cladding layer) 22A | p-$Al_{0.3}Ga_{0.7}As$ |
| Light-emitting portion 23 | i-GaAs/$Al_{0.3}Ga_{0.7}As$ |
| First compound semiconductor layer 21 | |
| First cladding layer 21B | n-$Al_{0.3}Ga_{0.7}As$ |
| First DBR layer 21A | DBR layer formed by alternately laminating n-$Al_{0.9}Ga_{0.1}As$ layers and n-$Al_{0.1}Ga_{0.9}As$ layers |

The light-emitting element is further provided with an insulating layer 26 formed over at least the side surface of the mesa structure 25 (more specifically, the side surface and a portion of the top of the mesa structure 25) and the first surface 21C of the first compound semiconductor layer 21, a second electrode 32 formed over the top of the second compound semiconductor layer 22 and the insulating layer 26, and a first electrode 31 formed on the second surface 21D of the first compound semiconductor layer 21. The insulating layer 26 is composed of SiN, the first electrode 31 has a laminated structure of AuGe/Ni/Au layers, and the second electrode 32 has a laminated structure of Au/Pt/Ti layers and Au/Ni/AuGe layers which are laminated in order. Here, "/" indicates the deposition sequence from the side nearer to the bottom of the recessed portion.

The mesa structure 25 of the light-emitting element is placed in the recessed portion 41 so that the conductive material layer 42 and the second electrode 32 are in at least partial contact with each other, and light from the light-emitting portion 23 is emitted from the second surface side of the first compound semiconductor layer 21.

More specifically, in Example 1, the first compound semiconductor layer 21 includes a first portion 21E which extends so as to face the first surface 40A of the support substrate 40 through the insulating layer 26 and a second portion 21F which projects from the first portion 21E. The first electrode 31 is formed on the first portion 21E of the first compound semiconductor layer 21, and the second portion 21F of the first compound semiconductor layer 21 is included in a projective image of the mesa structure 25 along the axial direction of the recessed portion 41. The light emitted from the light-emitting portion 23 is emitted from the second portion 21F of the first compound semiconductor layer 21. In Example 1, the planar shape of the second portion 21F of the first compound semiconductor layer 21 is substantially the same as the shape of the projective image of the mesa structure 25.

The support substrate 40 has conductivity so that a current is passed between the third electrode 43 and the first electrode 31 to emit light from the light-emitting portion 23. This applies to Examples 2 and 3 described below. In addition, the components of the light-emitting element assembly of Example 1 and the constituent materials of members basically apply to Examples 2 and 3 described below.

The method for manufacturing the light-emitting element of Example 1 is outlined with reference to FIGS. 2A, 2B, 3A, 3B, and 4 to 7 each of which is a schematic partial sectional view of a laminated structure, etc. Each of the layers may be formed by, for example, a MOCVD method. In this case, examples of raw materials of group III-V compound semiconductors include trimethyl aluminum (TMA), trimethyl gallium (TMG), and arsine ($AsH_3$). For example, $H_2Se$ is used as a raw material of donor impurities, and dimethyl zinc (DMZ) is used as a raw material of acceptor impurities. Further, each of the layers may be etched by, for example, dry etching with a chlorine-based etching gas.

Step-100

Figure 2A:
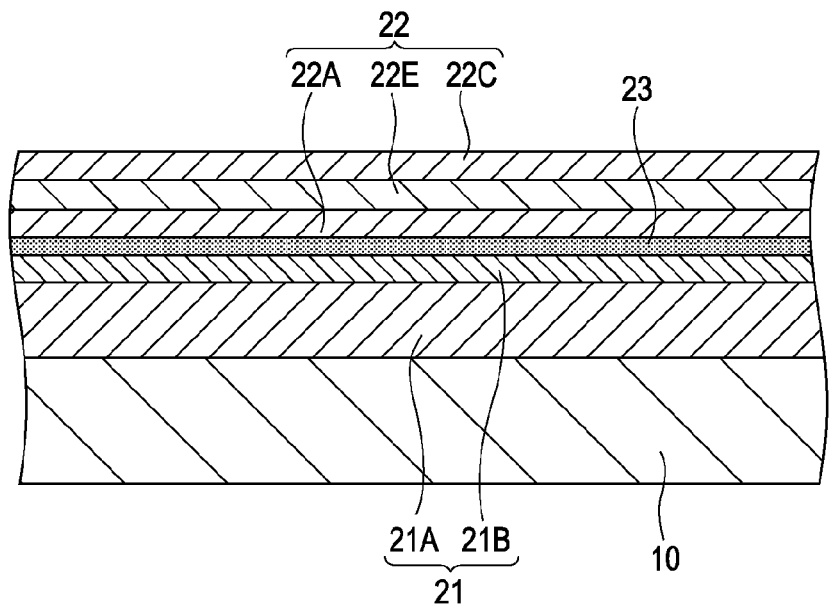
FIGS. 2A and 2B are schematic partial sectional views of a laminated structure, for illustrating a method for manufacturing the light-emitting element assembly of Example 1.
Figure 2B:
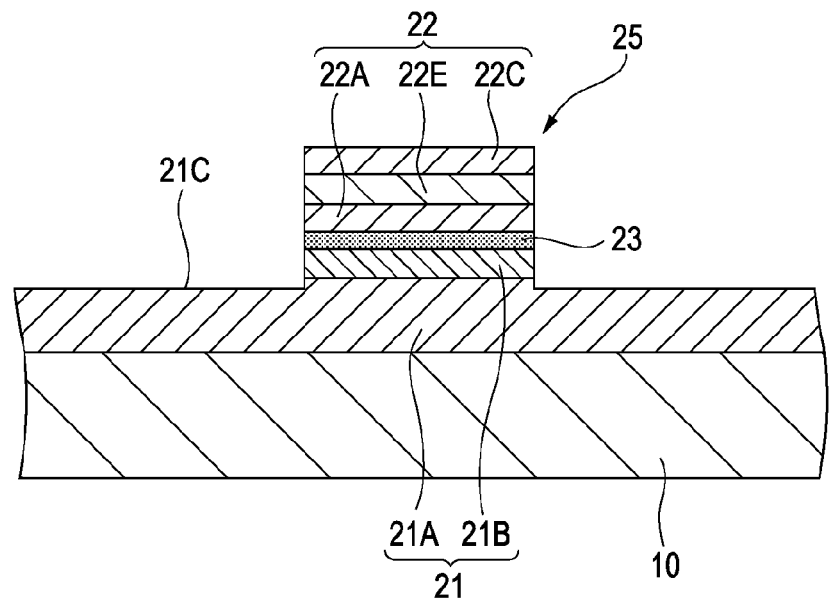

First, an etching stop layer (not shown) composed of AlGaInP, the first compound semiconductor layer 21 (the first DBR layer 21A and the first cladding layer 21B) of the first conductivity type (specifically, n type), the light-emitting portion (active layer) 23, and the second compound semiconductor layer 22 (the lower layer (second cladding layer) 22A, the intermediate layer 22E, and the upper layer (second DBR layer) 22C) of the second conductivity type (specifically, p type) are deposited in order on a main surface of an n-GaAs substrate 10 for manufacturing a light-emitting element by a MOCVD technique (refer to FIG. 2A).

Step-110

Next, at least the second compound semiconductor layer 22 and the light-emitting portion 23 are selectively removed to form the mesa structure 25 including at least the second compound semiconductor layer 22 and the light-emitting portion 23. Specifically, the second compound semiconductor layer 22, the light-emitting portion 23, and a portion of the first compound semiconductor layer 21 are selectively removed on the basis of a lithographic technique and etching technique (e.g., a RIE process using chlorine-based etching gas) to expose, as the first surface 21C, a portion of the first compound semiconductor layer 21 and form the columnar (for example, cylindrical) mesa structure 25 including at least the second compound semiconductor layer 22 and the light-emitting portion 23 which are left in an island form (refer to FIG. 2B). More specifically, the mesa structure 25 includes a portion of the first compound semiconductor layer 21, the light-emitting portion 23, and the second compound semiconductor layer 22 which are arranged in that order from below. Further, the mesa structure 25 is surrounded by the exposed portion of the first compound semiconductor layer 21.

Figure 3A:
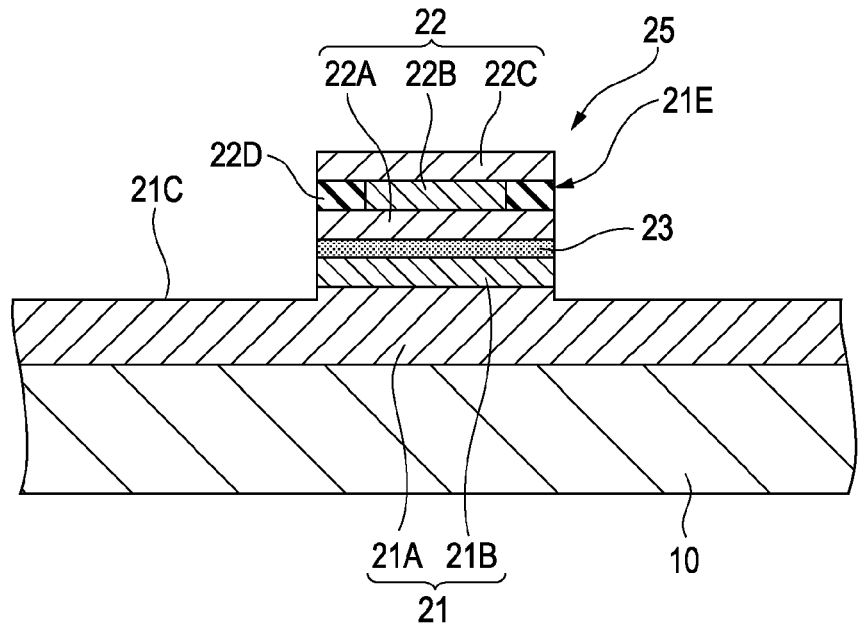
FIGS. 3A and 3B are schematic partial sectional views of a laminated structure, for illustrating the method for manufacturing the light-emitting element assembly of Example 1 in succession to FIG. 2B.
Figure 3B:
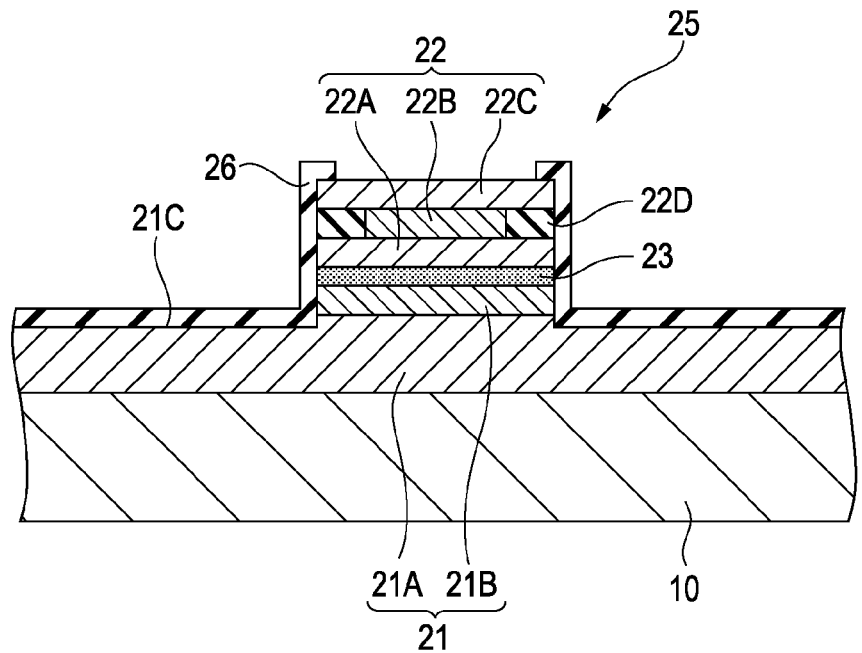
Figure 4:
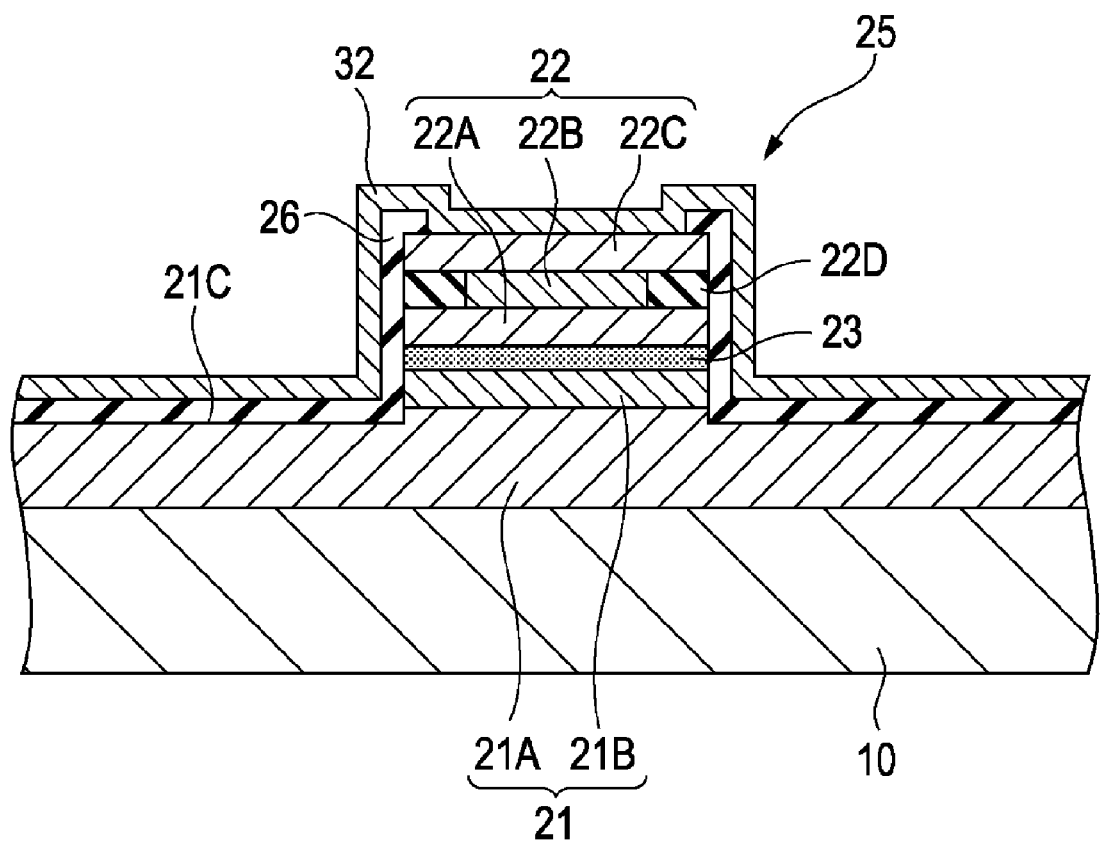
FIG. 4 is a schematic partial sectional view of a laminated structure, for illustrating the method for manufacturing the light-emitting element assembly of Example 1 in succession to FIG. 3B.

Next, an oxidation treatment is performed at a high temperature in a water vapor atmosphere to selectively oxidize the intermediate layer 22E from the exposed portion in the side surface of the mesa structure 25 to a central portion of the intermediate layer 22E, thereby forming the current-narrowing region 22B surrounded by the insulating region 22D (refer to FIG. 3A).

Step-120

Then, the insulating layer 26 composed of, for example, SiN is formed over the top and the side surface of the mesa structure 25 and the exposed first surface 21C of the first compound semiconductor layer 21 on the basis of a CVD process. Then, the insulating layer 26 is removed from the top of the mesa structure 25 on the basis of a lithographic technique and etching technique to expose the top of the second compound semiconductor layer 22 (refer to FIG. 3B). Then, the second electrode 32 is formed by a vacuum deposition method over the exposed top of the second compound semiconductor layer 22, a portion of the insulating layer 26 which is positioned on the side surface of the mesa structure 25, and a portion of the insulating layer 26 which is positioned on the first surface 21C of the first compound semiconductor layer 21 (refer to FIG. 4).

Step-130

Figure 5:
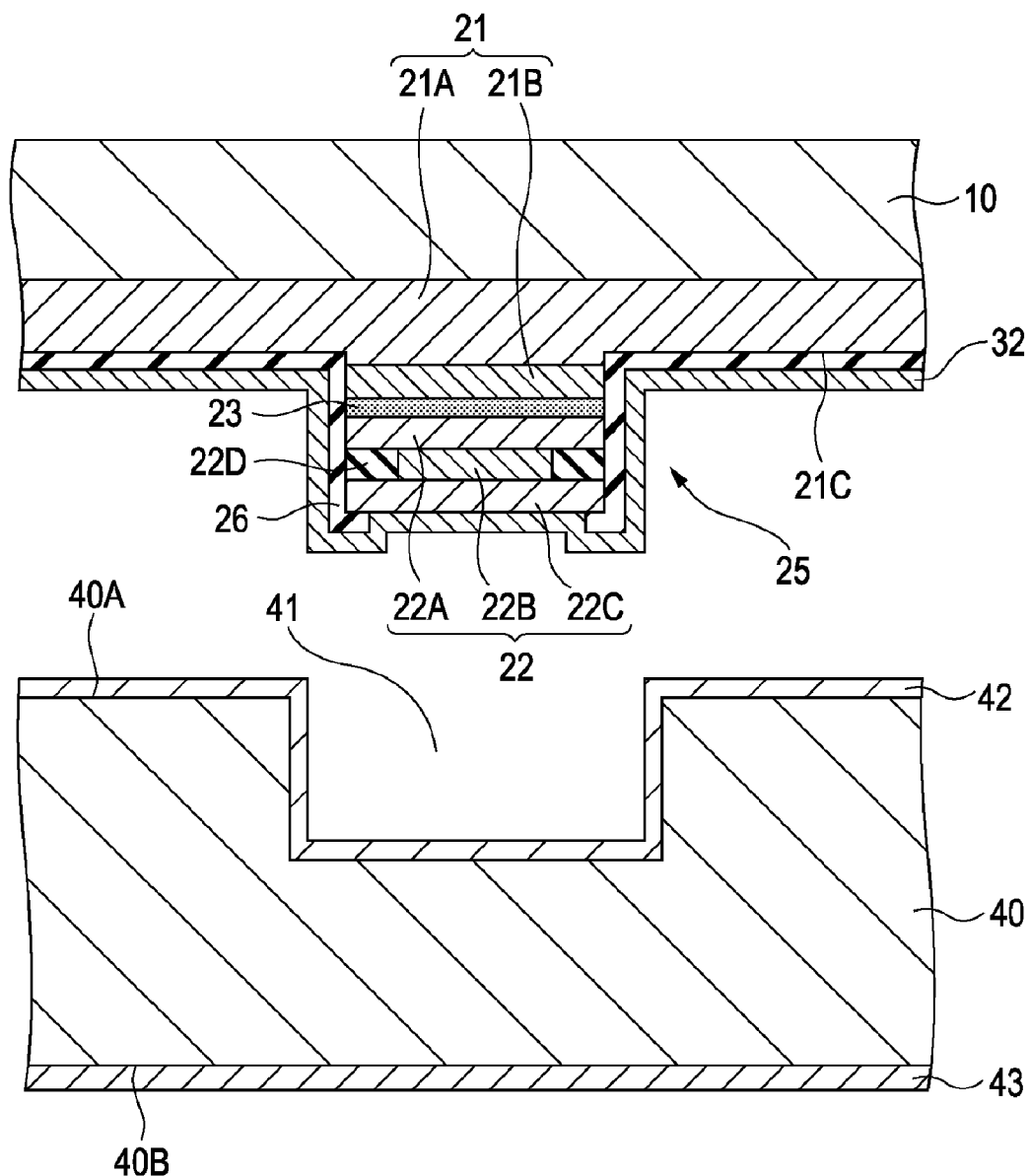
FIG. 5 is a schematic partial sectional view of a laminated structure, for illustrating the method for manufacturing the light-emitting element assembly of Example 1 in succession to FIG. 4.

On the other hand, the support substrate 40 having the first surface 40A, the second surface 40B facing the first surface 40A, the recessed portion 41 formed in the first surface 40A, and the conductive material layer 42 formed over the first surface 40A and the inner surface of the recessed portion 41 is prepared (refer to FIG. 5). The recessed portion 41 may be formed in the support substrate 40 on the basis of a lithographic technique and etching technique, and the conductive material layer 42 may be formed on the basis of a vacuum deposition process. Further, the third electrode 43 is formed on the second surface 40B of the support substrate 40 on the basis of a vacuum deposition process.

Figure 6:
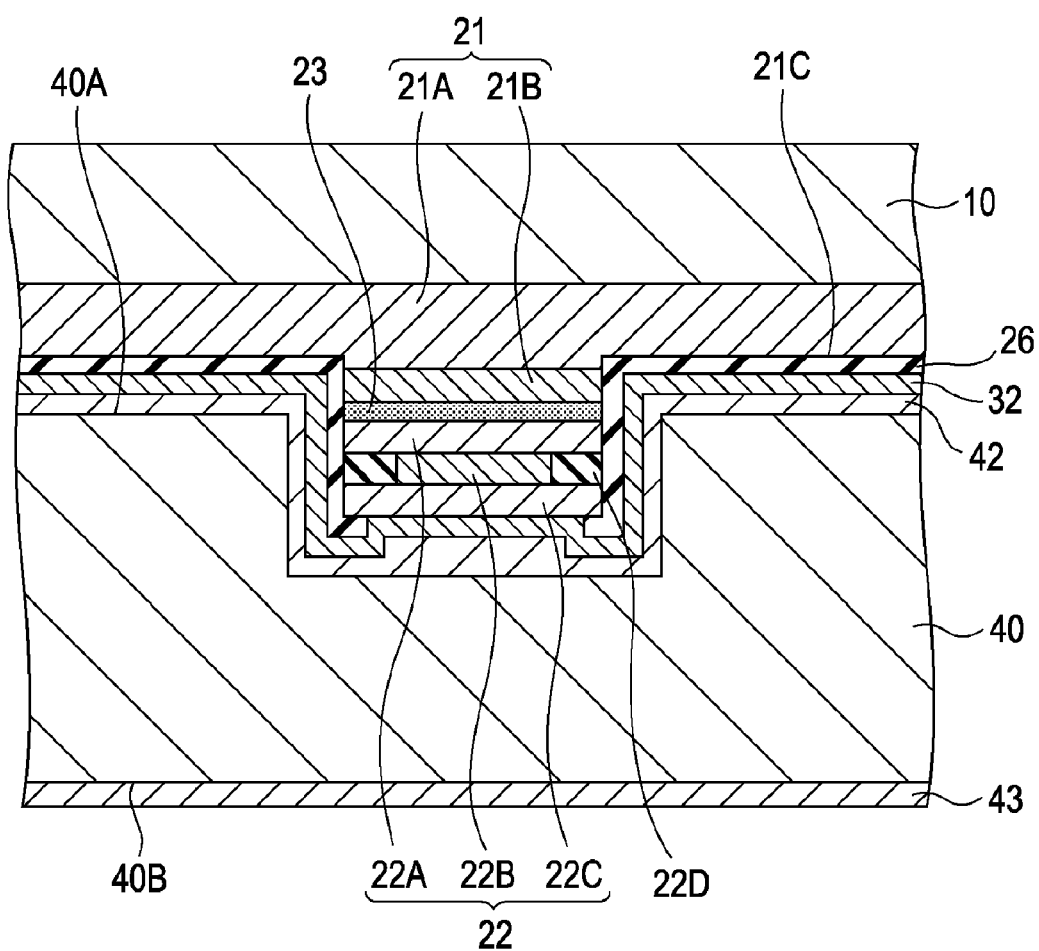
FIG. 6 is a schematic partial sectional view of a laminated structure, for illustrating the method for manufacturing the light-emitting element assembly of Example 1 in succession to FIG. 5.
Figure 7:
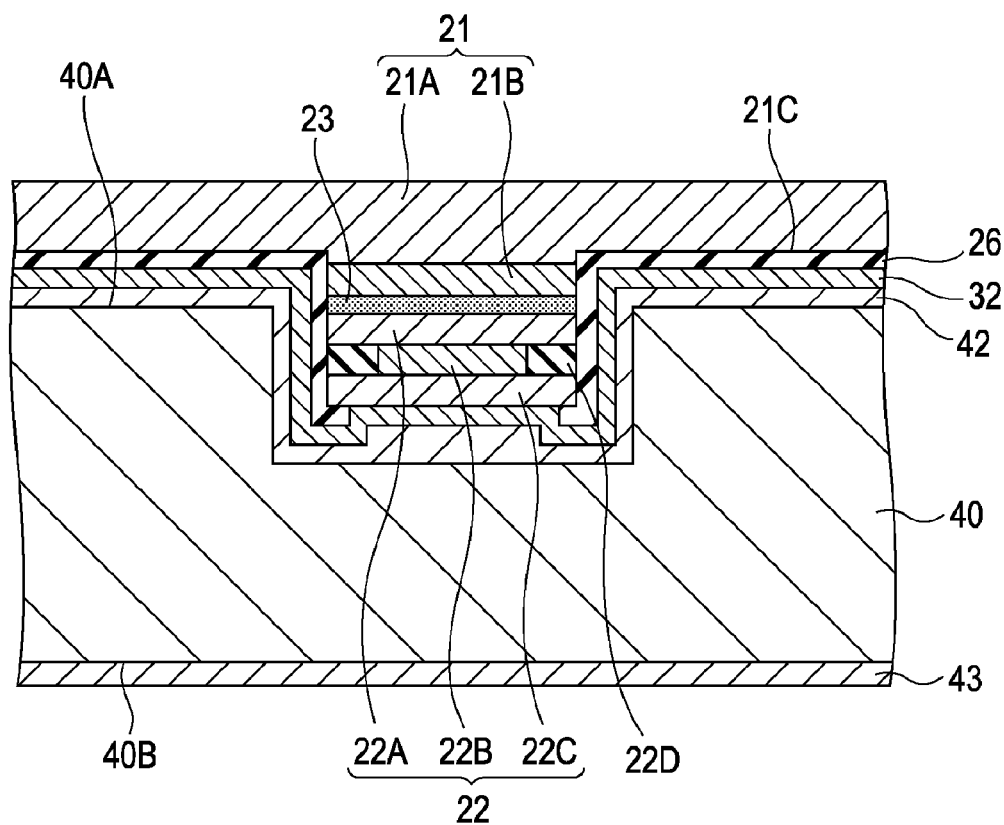
FIG. 7 is a schematic partial sectional view of a laminated structure, for illustrating the method for manufacturing the light-emitting element assembly of Example 1 in succession to FIG. 6.

Then, the mesa structure 25 of the light-emitting element is placed in the recessed portion 41 so that the conductive material layer 42 and the second electrode 32 are in at least partial contact with each other. Specifically, the mesa structure 25 of the light-emitting element is placed in the recessed portion 41, and then a force of about $1 \times 10^3$ N to $5 \times 10^3$ N is applied between the substrate 10 for manufacturing a light-emitting element and the support substrate 40. Then, the two substrates 10 and 40 are heated at about 300° C. to 600° C. for about 1 hour to form metal-metal bonding between the conductive material layer 42 and the second electrode 32. As a result, a structure shown in FIG. 6 is obtained.

Step-140

Then, the n-GaAs substrate 10 for manufacturing a light-emitting element is removed on the basis of a wet etching process using ammonia hyperhydration (refer to FIG. 7), and further the etching stop layer (not shown) is removed on the basis of a wet etching process using hydrochloric acid.

Step-150

Next, the first electrode 31 is formed on the exposed second surface 21D of the first compound semiconductor layer 21 which faces the first surface 21C thereof. Specifically, the first compound semiconductor layer 21 is partially removed in the thickness direction on the basis of a lithographic technique and etching technique. As a result, the first compound semiconductor layer 21 includes the first portion 21E which extends so as to face the first surface 40A of the support substrate 40 through the insulating layer 26 and a second portion 21F which projects from the first portion 21E. The surface of the first portion 21E of the first compound semiconductor layer 21 corresponds to the second surface 21D of the first compound semiconductor layer 21, and the second portion 21F of the first compound semiconductor layer 21 is included in the projective image of the mesa structure 25 along the axial direction of the recessed portion 41. The light emitted from the light-emitting portion 23 is emitted from the second portion 21F of the first compound semiconductor layer 21. Then, the first electrode 31 is formed on the first portion 21E of the first compound semiconductor layer 21, i.e., on the second surface 21D of the first compound semiconductor layer 21, on the basis of a so-called liftoff method and a vacuum deposition method. As a result, a structure shown in FIG. 1 is formed.

Step-160

Then, the first electrode 31 is alloyed, and light-emitting element assemblies are divided (separated) into individual assemblies by, for example, a dicing method.

In the light-emitting element assembly of Example 1, the mesa structure 25 of the light-emitting element is placed in the recessed portion 41 so that the conductive material layer 42 and the second electrode 32 are in at least partial contact with each other. Therefore, the conductive material layer 42 is present near the light-emitting portion 23, and thus heat generated in the light-emitting portion 23 may be efficiently radiated. Consequently, it may be possible to effectively prevent the occurrence of the problem of decreasing the emission efficiency of the light-emitting element and extend the operating temperature range. In addition, the light emitted from the light-emitting portion 23 is emitted from the second surface side of the first compound semiconductor layer 21. However, the emitted light is not absorbed by the substrate because the substrate 10 for manufacturing a light-emitting element is removed, and the degree of freedom of material selection for the substrate for manufacturing a light-emitting element is increased.

EXAMPLE 2

Example 2 is a modification of Example 1 and relates to a light-emitting element assembly having a second configuration.

Figure 8:
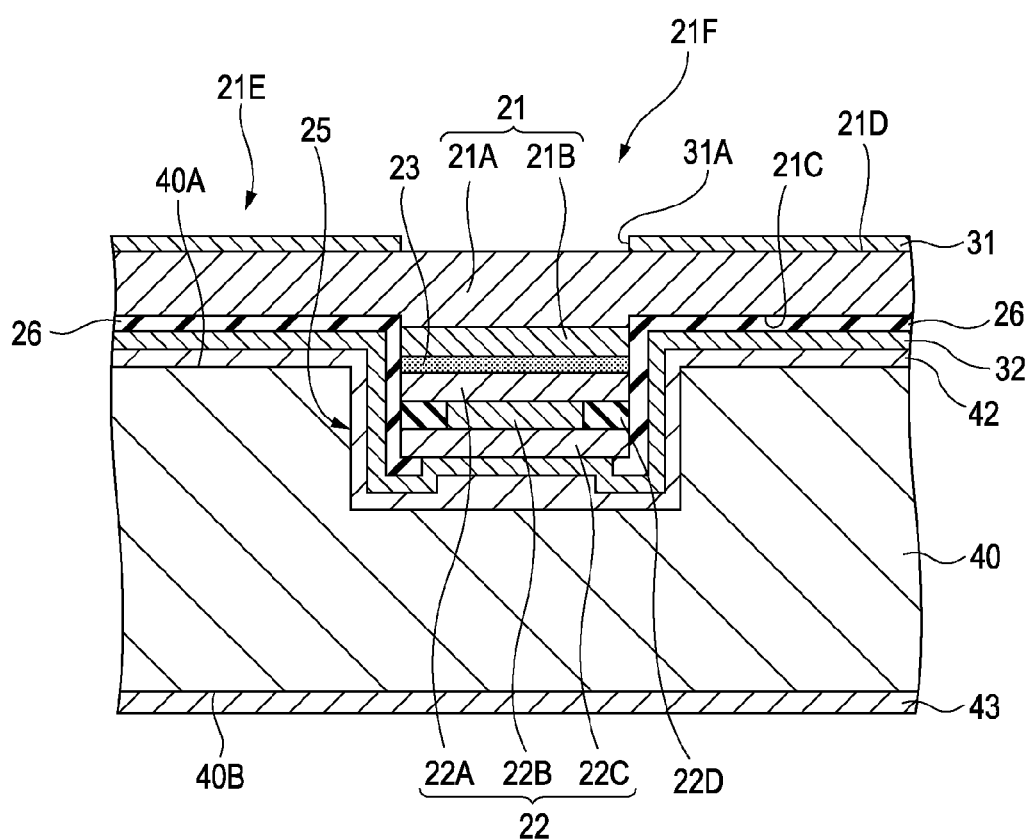
FIG. 8 is a schematic partial sectional view of a laminated structure, for illustrating a method for manufacturing a light-emitting element assembly of Example 2.

As schematically shown in a partial sectional view of FIG. 8, in a light-emitting element assembly of Example 2, a first electrode 32 is not formed in a projective image of a mesa structure 25 along the axial direction of a recessed portion 41. In addition, unlike in Example 1, a first compound semiconductor layer 21 is not divided into first and second portions. The planar shape of the edge 31A of the first electrode 31 is the same as the shape of the projective image of the mesa structure 25.

Except for this point, the configuration and structure of the light-emitting element assembly of Example 2 may be the same as those of the light-emitting element assembly of Example 1. Therefore, detail description is omitted. In the light-emitting element assembly of Example 2, the first electrode 31 may be formed, on the basis of a so-called liftoff method and vacuum deposition method, on the exposed second surface 21D of the first compound semiconductor layer 21 which faces the first surface 21C thereof in the same manner as in Step-150 in Example 1.

EXAMPLE 3

Example 3 relates to a method for manufacturing a light-emitting element assembly according to a second embodiment of the present invention. The method for manufacturing the light-emitting element of Example 3 is outlined with reference to FIGS. 9, 10, 11, 12, and 13 which are schematic partial sectional views of a laminated structure, etc.

Step-300

Figure 9:
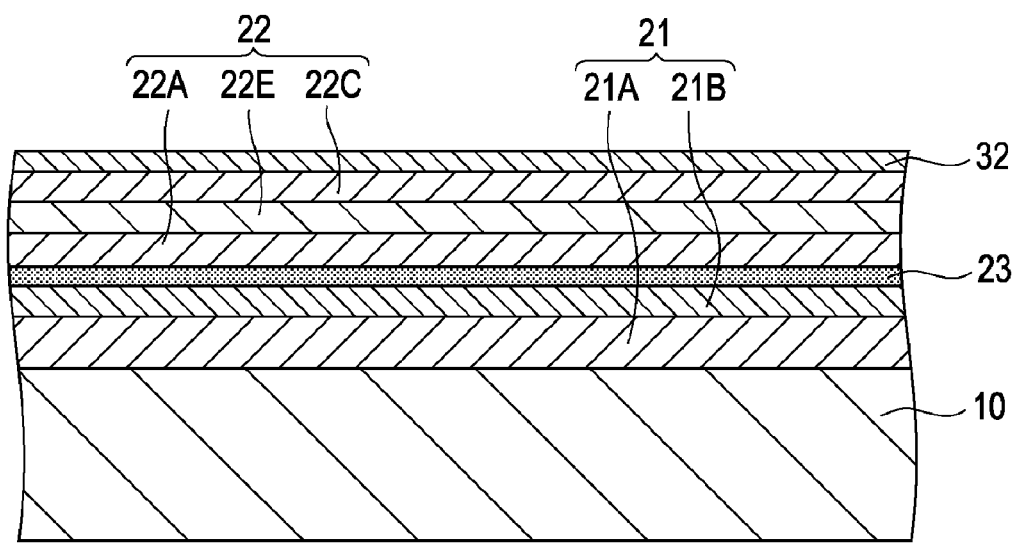
FIG. 9 is a schematic partial sectional view of a laminated structure, for illustrating a method for manufacturing a light-emitting element assembly of Example 3.

First, in the same manner as in Step-100 of Example 1, an etching stop layer (not shown), a first compound semiconductor layer 21 (a first DBR layer 21A and a first cladding layer 21B) of a first conductivity type (specifically, n type), a light-emitting portion (active layer) 23, and a second compound semiconductor layer 22 (a lower layer (second cladding layer) 22A, an intermediate layer 22E, and an upper layer (second DBR layer) 22C) of a second conductivity type (specifically, p type) are deposited in order on a main surface of a n-GaAs substrate 10 for manufacturing a light-emitting element by a MOCVD technique. Further, a second electrode 32 is formed on the second compound semiconductor layer 22 by a vacuum deposition method. As a result, a structure shown in FIG. 9 is formed.

Step-310

Figure 10:
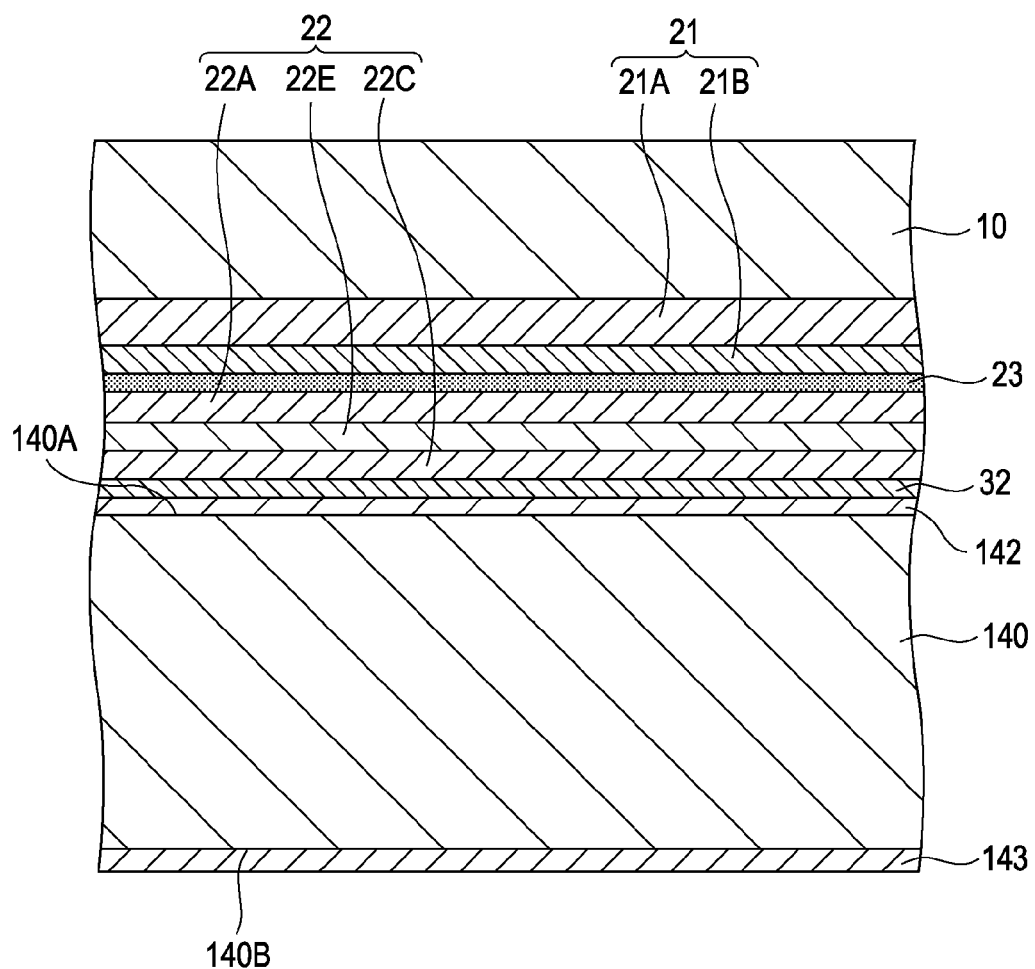
FIG. 10 is a schematic partial sectional view of a laminated structure, for illustrating the method for manufacturing the light-emitting element assembly of Example 3 in succession to FIG. 9.
Figure 11:
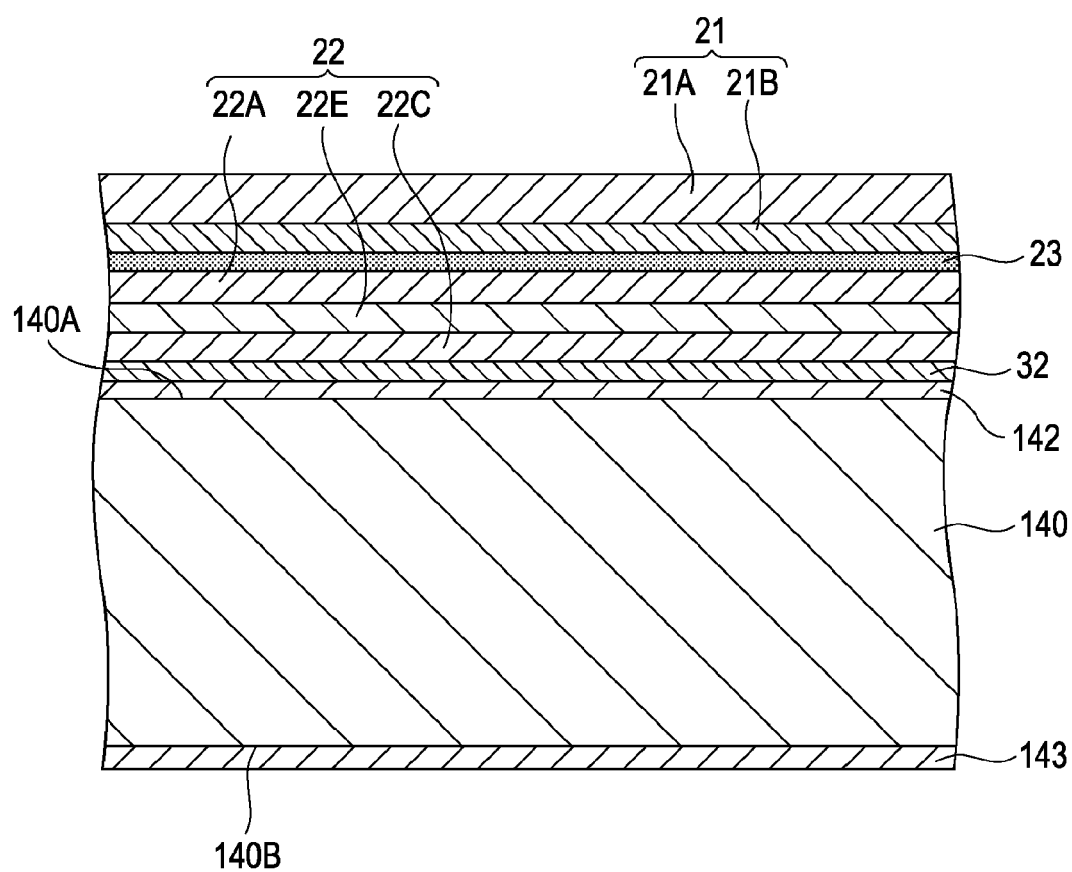
FIG. 11 is a schematic partial sectional view of a laminated structure, for illustrating the method for manufacturing the light-emitting element assembly of Example 3 in succession to FIG. 10.
Figure 12:
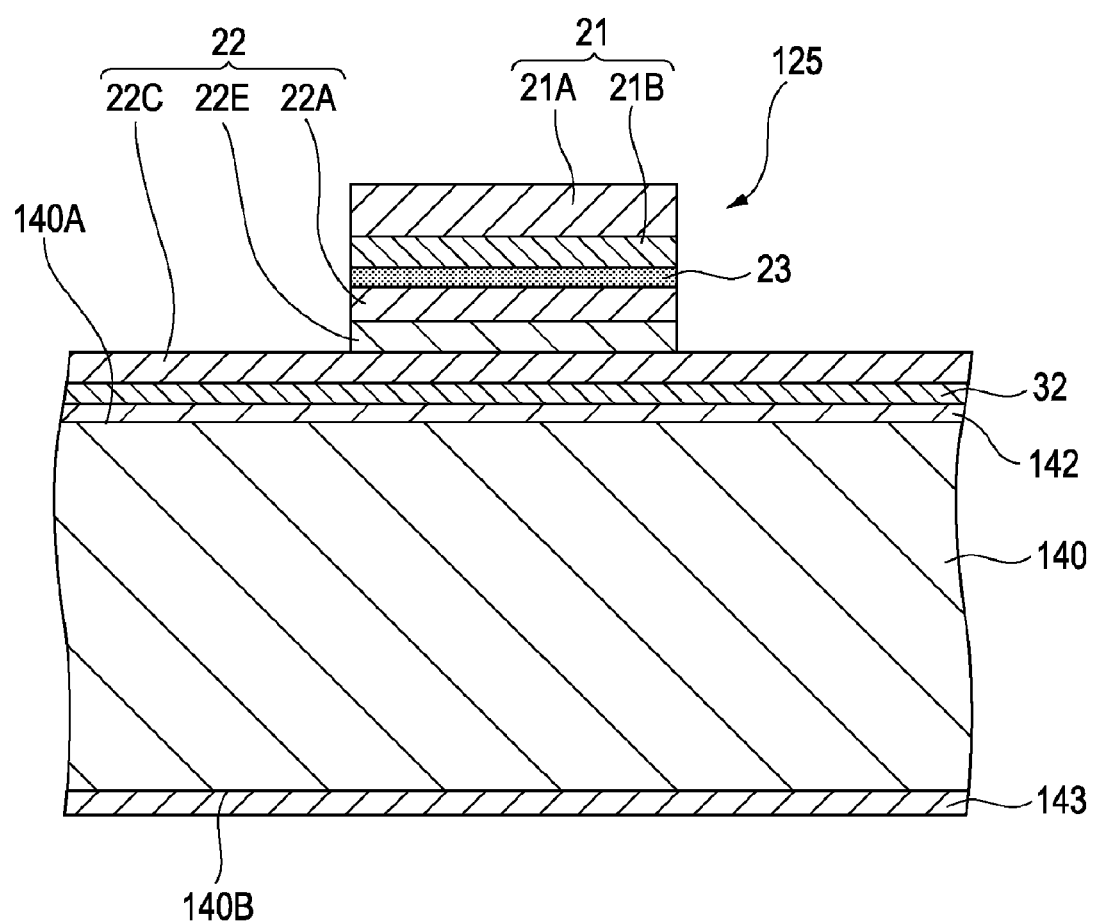
FIG. 12 is a schematic partial sectional view of a laminated structure, for illustrating the method for manufacturing the light-emitting element assembly of Example 3 in succession to FIG. 11.

On the other hand, in the same manner as in Step-130 of Example 1, a support substrate 140 having a first surface 140A, a second surface 140B facing the first surface 140A, and a conductive material layer 142 formed on the first surface 140A is prepared. Further, a third electrode 143 is formed on the second surface 140B of the support substrate 140. Then, in the same manner as in Step-130 of Example 1, the second electrode 32 is bonded to the conductive material layer 142 formed on the first surface 140A of the support substrate 140 to form metal-metal bonding between the conductive material layer 142 and the second electrode 32. As a result, a structure shown in FIG. 10 is obtained.

Step-320

Then, in the same manner as in Step-140 of Example 1, the substrate 10 for manufacturing a light-emitting element is removed (refer to FIG. 11), and further the etching stop layer is removed.

Step-330

Next, a mesa structure 125 including at least the first compound semiconductor layer 21 and the light-emitting portion 23 is formed. That is, at least the first compound semiconductor layer 21 and the light-emitting portion 23 are selectively removed to form the mesa structure 125 including at least the first compound semiconductor layer 21 and the light-emitting portion 23. Specifically, the first compound semiconductor layer 21, the light-emitting portion 23, and a portion of the second compound semiconductor layer 22 are selectively removed on the basis of a lithographic technique and etching technique (e.g., a RIE process using chlorine-based etching gas) to expose a portion of the second compound semiconductor layer 22 and form the columnar (for example, cylindrical) mesa structure 125 including at least the first compound semiconductor layer 21 and the light-emitting portion 23 which are left in an island form (refer to FIG. 12). More specifically, the mesa structure 125 includes a portion of the second compound semiconductor layer 22, the light-emitting portion 23, and the first compound semiconductor layer 21 which are arranged in that order from below. Further, the mesa structure 125 is surrounded by the exposed second compound semiconductor layer 22.

Next, an oxidation treatment is performed at a high temperature in a water vapor atmosphere to selectively oxidize the intermediate layer 22E from the exposed portion in the side surface of the mesa structure 125 to a central portion of the intermediate layer 22E, thereby forming a current-narrowing region 22B surrounded by an insulating region 22D.

Step-340

Figure 13:
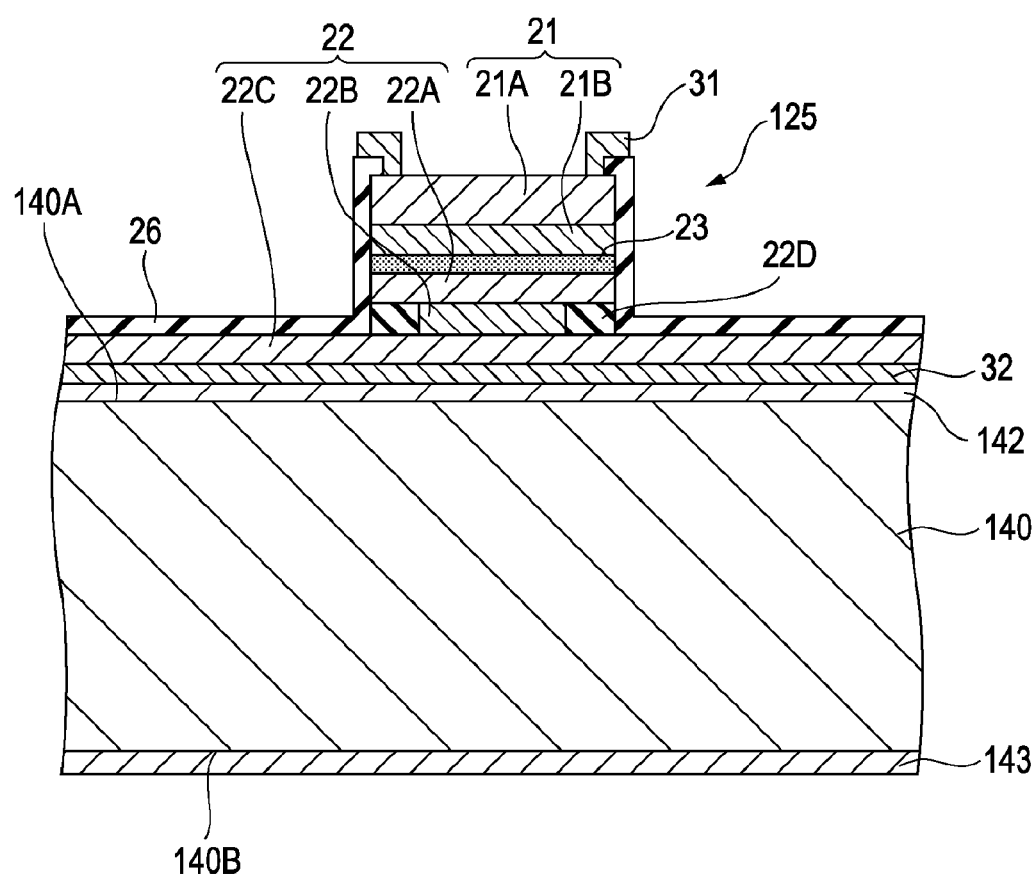
FIG. 13 is a schematic partial sectional view of a laminated structure, for illustrating the method for manufacturing the light-emitting element assembly of Example 3 in succession to FIG. 12.

Then, an insulating layer 26 composed of, for example, SiN is formed over the top and the side surface of the mesa structure 125 and the exposed surface of the second compound semiconductor layer 22 on the basis of a CVD process. Then, the insulating layer 26 is removed from the top of the mesa structure 125 on the basis of a lithographic technique and etching technique to expose the top of the first compound semiconductor layer 21. Then, a first electrode 31 is formed by a liftoff method and a vacuum deposition method on the exposed top of the first compound semiconductor layer 21. As a result, a light-emitting element assembly having a structure shown in FIG. 13 is obtained.

Although the present invention is described above on the basis of the preferred examples, the present invention is not limited to these examples. The configurations, the structures, and the constituent materials and compositions of the light-emitting element and the light-emitting element assembly described in each of the examples are only examples and may be appropriately changed. For example, a laminated structure including a second compound semiconductor layer, a light-emitting portion, and a first compound semiconductor layer which are arranged in that order from the side of a substrate for manufacturing a light-emitting element may be used. In other words, a laminated structure (the second DBR layer 22C of the second compound semiconductor layer 22 as a lowermost layer and the first DBR layer 21A of the first compound semiconductor layer 21 as an uppermost layer), which is vertically reversed to the laminated structure of the light-emitting element described in the first to third examples, may be formed on a proper substrate for manufacturing a light-emitting element. In addition, the light-emitting element may be a light-emitting diode (LED).

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a light-emitting element assembly comprising the steps of:
    (a) preparing a support substrate having a first surface, a second surface facing the first surface, a recessed portion formed in the first surface, and a conductive material layer formed over the first surface and the inner surface of the recessed portion;
    (b) successively forming a first compound semiconductor layer of a first conductivity type, a light-emitting portion, and a second compound semiconductor layer of a second conductivity type on a substrate for manufacturing a light-emitting element;
    (c) selectively removing at least the second compound semiconductor layer and the light-emitting portion to form a mesa structure including at least the second compound semiconductor layer and the light-emitting portion;
    (d) forming an insulating layer over the top and the side surface of the mesa structure and an exposed portion of a first surface of the first compound semiconductor layer, partially removing the insulating layer from the top of the mesa structure to expose the top of the second compound semiconductor layer, and then forming a second electrode over the exposed top of the second compound semiconductor layer, a portion of the insulating layer which is disposed on the side surface of the mesa structure, and a portion of the insulating layer which is disposed on the first surface of the first compound semiconductor layer;
    (e) placing the mesa structure of the light-emitting element in the recessed portion so that the conductive material layer and the second electrode are in at least partial contact with each other;
    (f) removing the substrate for manufacturing a light-emitting element, and
    (g) forming a first electrode on an exposed second surface of the first compound semiconductor layer which faces the first surface thereof.

2. The method for manufacturing a light-emitting element assembly according to claim 1 further comprising a step of partially removing the first compound semiconductor layer in the thickness direction thereof in succession to the step (f) wherein:
    the first compound semiconductor layer is partially removed in the thickness direction to form a first portion extending so as to face the first surface of the support substrate through the insulating layer and a second portion projecting from the first portion;
    the first electrode is formed on the first portion of the first compound semiconductor layer;
    the second portion of the first compound semiconductor layer is included in a projective image of the mesa structure along the axial direction of the recessed portion; and
    light emitted from the light-emitting portion is emitted from the second portion of the first compound semiconductor layer.

3. The method for manufacturing a light-emitting element assembly according to claim 1, wherein the first electrode is not formed within the projective image of the mesa structure along the axial direction of the recessed portion.

4. The method for manufacturing a light-emitting element assembly according to claim 1, wherein a third electrode is formed on the second surface of the support substrate, and the support substrate has electric conductivity.

5. The method for manufacturing a light-emitting element assembly according to claim 1, wherein the light-emitting element is a surface emitting laser element.

6. A method for manufacturing a light-emitting element assembly comprising the steps of:
    (a) preparing a support substrate having a first surface, a second surface facing the first surface, and a conductive material layer formed on the first surface;
    (b) successively forming a first compound semiconductor layer of a first conductivity type, a light-emitting portion, and a second compound semiconductor layer of a second conductivity type on a substrate for manufacturing a light-emitting element;
    (c) forming a second electrode on the second compound semiconductor layer;
    (d) bonding together the second electrode and the conductive material layer formed on the first surface of the support substrate;
    (e) removing the substrate for manufacturing a light-emitting element;
    (f) forming a mesa structure including at least the first compound semiconductor layer and the light-emitting portion; and
    (g) forming a first electrode on the top of the first compound semiconductor layer.

7. The method for manufacturing a light-emitting element assembly according to claim 6, wherein a third electrode is formed on the second surface of the support substrate, and the support substrate has electric conductivity.

8. The method for manufacturing a light-emitting element assembly according to claim 6, wherein the light-emitting element is a surface emitting laser element in which light is emitted from the exposed top of the first compound semiconductor layer.

* * * * *